(12) United States Patent
Lekas et al.

(10) Patent No.: US 10,878,996 B2
(45) Date of Patent: Dec. 29, 2020

(54) COMPACT TRANSCEIVER ON A MULTI-LEVEL INTEGRATED CIRCUIT

(71) Applicant: Ferric Inc., New York, NY (US)

(72) Inventors: Michael Lekas, New York, NY (US); Noah Sturcken, New York, NY (US)

(73) Assignee: Ferric Inc., New York, NY (US)

( * ) Notice: Subject to any disclaimer, the term of this patent is extended or adjusted under 35 U.S.C. 154(b) by 0 days.

(21) Appl. No.: 16/778,154

(22) Filed: Jan. 31, 2020

(65) Prior Publication Data

US 2020/0168394 A1    May 28, 2020

Related U.S. Application Data

(62) Division of application No. 16/118,113, filed on Aug. 30, 2018, now Pat. No. 10,593,470.

(51) Int. Cl.
| | |
|---|---|
| *H01L 23/64* | (2006.01) |
| *H01F 38/14* | (2006.01) |
| *H02J 50/12* | (2016.01) |
| *H04B 5/00* | (2006.01) |
| *H01F 27/24* | (2006.01) |

(52) U.S. Cl.
CPC .............. *H01F 38/14* (2013.01); *H01F 27/24* (2013.01); *H01L 23/645* (2013.01); *H02J 50/12* (2016.02); *H04B 5/0031* (2013.01); *H04B 5/0037* (2013.01); *H01F 2038/143* (2013.01); *H01L 2223/6627* (2013.01)

(58) Field of Classification Search
CPC ................................ H01F 38/14; H02J 50/12
See application file for complete search history.

(56) References Cited

U.S. PATENT DOCUMENTS

| | | | |
|---|---|---|---|
| 6,927,738 B2 * | 8/2005 | Senba | G06K 19/0723 343/787 |
| 2018/0198308 A1 | 7/2018 | Files et al. | |
| 2018/0269728 A1 * | 9/2018 | Liu | H01F 27/29 |

* cited by examiner

*Primary Examiner* — Tuan H Nguyen
(74) *Attorney, Agent, or Firm* — Intrinsic Law Corp.

(57) ABSTRACT

Power and/or data are transmitted through variable magnetic fields between a first transceiver coil on a transceiver apparatus and a second transceiver coil in an inductor integrated into a multilevel wiring structure on a semiconductor integrated circuit chip. The first transceiver apparatus generates magnetic fields and can transmit data by varying a characteristic of the magnetic fields. The second transceiver coil receives the power from and/or detects data in the magnetic fields from the first transceiver apparatus. The inductor can include a ferromagnetic core that concentrates magnetic flux to improve data or power transmission efficiency to miniaturize the second transceiver coil while maintaining adequate inductive coupling between the coils. The second transceiver coil can transmit data by varying the impedance of the inductor and/or the integrated circuit. The semiconductor integrated circuit chip can be coupled to an object and the second transceiver coil can transmit data relating to the object.

20 Claims, 11 Drawing Sheets

COMPACT TRANSCEIVER ON A MULTI-LEVEL INTEGRATED CIRCUIT

RELATED APPLICATIONS

The present application is a divisional of U.S. application Ser. No. 16/118,113 filed on Aug. 30, 2018, entitled "Compact Transceiver on a MultiLevel Integrated Circuit".

TECHNICAL FIELD

This application relates generally to wireless transmission of power and/or signals using inductive coupling.

BACKGROUND

Inductive coupling is commonly used for wireless power and data transfer in modern electrical systems. Near-field magnetic induction systems often employ a pair of electrical coils to induce and sense changes in magnetic flux, which provides a wireless link between the electrical coils to transfer signals and power. The inductive coupling coefficient, k, at the frequency of signal/power transmission is the key figure of merit for such wireless links, as it represents the fraction of power or signal that is emitted from one coil and received by another. A higher coupling coefficient corresponds to higher efficiency for power transfer over the wireless link, or higher signal-to-noise ratio for signals transferred over the link. The coupling coefficient between a pair of coils is dependent on the design of both coils as well as the relative placement and orientation of each coil with respect to the other.

For a given wireless inductive link there is a minimum received signal or power level at which the link is functional. If the signal or power level received is less than this level, the receiver may not be able to discern between actual signal information and noise that is present in the system, or the power received may be too low for any dependent voltage conversion functions to operate correctly.

It would be desirable to decrease the size of one of the electrical coils, for example to attach or integrate the electrical coil onto or into another object. However, there is no known method to decrease the electrical coil's size without decreasing its coupling coefficient.

SUMMARY

Example embodiments described herein have innovative features, no single one of which is indispensable or solely responsible for their desirable attributes. The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Without limiting the scope of the claims, some of the advantageous features will now be summarized. Other objects, advantages and novel features of the disclosure will be set forth in the following detailed description of the disclosure when considered in conjunction with the drawings, which are intended to illustrate, not limit, the invention.

An aspect of the invention is directed to a system for transmitting power or data through variable magnetic fields. The system comprises a first transceiver apparatus comprising a first transceiver coil that generates first variable magnetic fields; a semiconductor integrated circuit comprising a multilevel wiring network fabricated on a semiconductor die; and an inductor integrated into the multilevel wiring network. The inductor comprises a magnetic core; and a second transceiver coil that is wound in a generally spiral manner on the outside of the magnetic core, the second transceiver coil including at least one level from the multilevel wiring network. The conductive winding is electrically coupled to active circuit elements on the semiconductor die, and the first and second transceiver coils are inductively coupled to each other.

In one or more embodiments, the magnetic core includes a ferromagnetic material that concentrates a magnetic flux at the second transceiver coil to improve the inductive coupling between the first and second transceiver coils. In one or more embodiments, the ferromagnetic material has a relative permeability of 50 or greater. In one or more embodiments, the magnetic core includes an alternating sequence of ferromagnetic layers and insulating layers, each insulating layer disposed between neighboring ferromagnetic layers, wherein the insulating layers suppress eddy currents in the presence of alternative magnetic fields up to 3 GHz in frequency. In one or more embodiments, the ferromagnetic material is between 100 nm and 10,000 nm in thickness.

In one or more embodiments, the active circuit elements are configured to modulate a combined impedance of the second transceiver coil and the semiconductor integrated circuit to transmit data to the first transceiver coil. In one or more embodiments, the second transceiver coil comprises a first conductive interconnect layer on a first level of the multilevel wiring network, a second conductive interconnect layer on a second level of the multilevel wiring network, and vertical interconnect accesses (VIAs) that electrically couple the first and second conductive interconnect layers through openings defined in an electrically-insulating dielectric material that otherwise electrically isolates the first and second conductive interconnect layers from each other and from the magnetic core, whereby the second transceiver coil has a solenoid configuration. In one or more embodiments, the magnetic core includes a ferromagnetic material that increases an inductance of the inductor, the magnetic core disposed between the first and second conductive interconnect layers. In one or more embodiments, the ferromagnetic material is characterized by low magnetic coercivity along an axis, the second transceiver coil extending along the axis.

In one or more embodiments, semiconductor die, including the semiconductor integrated circuit and the inductor, has a length of less than 1 mm, a width of less than 1 mm, and a height of less than 1 mm. In one or more embodiments, the length is less than 0.4 mm, the width is less than 0.4 mm, and the height is less than 0.2 mm. In one or more embodiments, a diameter of the first transceiver coil is larger than the largest dimension of the semiconductor die so that the semiconductor die can be disposed within the first transceiver coil.

In one or more embodiments, the first and second transceiver coils are disposed so that an angle between a first magnetic flux axis and a second magnetic flux is 0 degrees to 60 degrees, wherein a first magnetic flux passes through an interior of the first transceiver coil along the first magnetic flux axis and the second magnetic flux passes through an interior of the second transceiver coil along the second magnetic flux axis. In one or more embodiments, the multilevel wiring network is wire routed in a star pattern or in a spine pattern to reduce parasitic magnetic coupling between (a) the first and second transceiver coils and (b) the multilevel wiring network that does not include the second transceiver coil.

In one or more embodiments, the system further comprises an additional second transceiver coil, wherein a second magnetic flux passes through an interior of each second transceiver coil along a respective second magnetic flux axis, the second magnetic flux axes orthogonal to each other. In one or more embodiments, the semiconductor integrated circuit includes logic to modulate an impedance of the inductor to transmit data to the first transceiver apparatus. In one or more embodiments, the semiconductor die is mechanically coupled to an object and the logic is configured to transmit data relating to the object.

Another aspect of the invention is directed to a method for transmitting power or data through magnetic fields. The method comprises passing a first variable electrical current through a first transceiver coil in a first transceiver apparatus; generating a variable magnetic flux that passes through an interior of the first transceiver coil, the variable magnetic flux extending along a first flux axis to a semiconductor integrated circuit chip, the semiconductor integrated circuit chip including a second transceiver coil disposed about an outside of a magnetic core; generating a second variable current in the second transceiver coil, the second variable current based on the variable magnetic flux; and modulating an impedance of the second transceiver coil to transmit data to the first transceiver apparatus.

In one or more embodiments, the method further comprises passing the second variable current through an integrated circuit on the semiconductor integrated circuit chip, the integrated circuit comprising a multilevel wiring structure that is electrically coupled to active circuit elements. In one or more embodiments, the integrated circuit is configured with logic to modulate the impedance of the second transceiver coil to transmit the data to the first transceiver coil. In one or more embodiments, the logic is configured to transmit encrypted data to the first transceiver coil. In one or more embodiments, the encrypted data includes a unique identifier relating to an object, the object mechanically and/or electrically coupled to the semiconductor integrated circuit chip.

In one or more embodiments, the method further comprises detecting the modulated impedance with the first transceiver apparatus to receive the encrypted data. In one or more embodiments, the method further comprises, with the first transceiver apparatus: decrypting the encrypted data to receive the unique identifier; querying a database in communication with the first transceiver apparatus to determine if the unique identifier exists in the database; determining that the object is authentic when the unique identifier exists in the database; and determining that the object is fraudulent when the unique identifier does not exist in the database.

In one or more embodiments, the method further comprises modulating an impedance of the first transceiver coil to transmit data to the second transceiver coil. In one or more embodiments, the method further comprises angularly restricting an angle between a first magnetic flux axis and a second magnetic flux axis to an angular range of 0 degrees to 60 degrees, wherein a first magnetic flux passes through an interior of the first transceiver coil along the first magnetic flux axis and the second magnetic flux passes through an interior of the second transceiver coil along the second magnetic flux axis.

BRIEF DESCRIPTION OF THE DRAWINGS

For a fuller understanding of the nature and advantages of the present concepts, reference is made to the following detailed description of preferred embodiments and in connection with the accompanying drawings, in which.

DETAILED DESCRIPTION

A wireless communication and/or power link is formed by inductively coupling first and second transceiver coils through a variable magnetic field. The first transceiver coil is disposed on or in a first transceiver apparatus. The second transceiver coil is integrated into a multilevel wiring structure on a semiconductor integrated circuit chip. The first transceiver coil generates the variable magnetic field and it can transmit data, signals, commands, and/or other information by varying or modulating a characteristic (e.g., frequency and/or amplitude) of the variable magnetic field. The second transceiver coil can transmit data, signals, commands, and/or other information by varying or modulating its impedance. The semiconductor integrated circuit, including the second transceiver coil, can be coupled mechanically and/or electrically to an object. The data, signals, commands, and/or other information transmitted between the first and second receiver coils can be related to the object. In one example, the second transceiver coil transmits encrypted data that can be used by the first transceiver apparatus to determine if the object is authentic or fraudulent.

The second transceiver coil can correspond to the conductive winding of an inductor. The inductor can include a ferromagnetic core that concentrates the magnetic flux at the second transceiver coil to improve the inductive coupling between the first and second transceiver coils. The increased concentration of magnetic flux and inductive flux coupling can allow the second transceiver coil to be miniaturized without reducing the inductive coupling coefficient k between the first and second coils.

Figure 1:
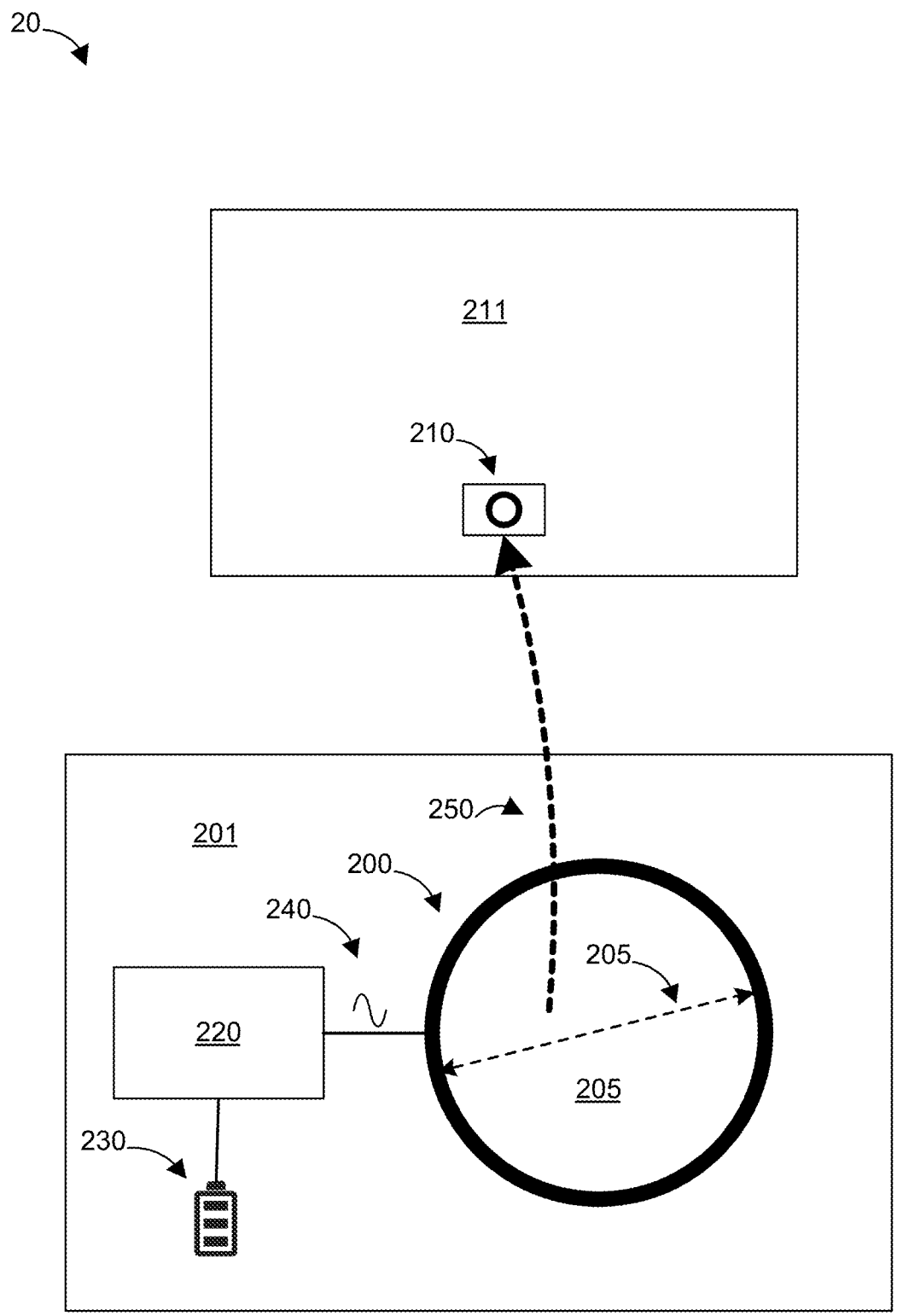
FIG. 1 is a perspective view of a system for transferring power or data through alternating magnetic fields according to one or more embodiments.

FIG. 1 is a perspective view of a system 20 for transferring power or data through alternating magnetic fields according to one or more embodiments. The system 20 includes a first transceiver coil 200 and a second transceiver coil 210.

The first transceiver coil 200 is disposed on or in a first transceiver apparatus 201. In some embodiments, the first transceiver coil 200 can be or can include an air-core inductor. The first transceiver apparatus 201 can include a housing, a display, a processor, memory, one or more network communication ports and modems/radios (such as for wired and/or wireless (e.g., Wi-Fi, cellular, and/or Bluetooth) network communication), a user interface (e.g., a keyboard, a mouse, a trackpad, and/or button(s)), and/or other components. The first transceiver coil 200 is electrically coupled to an electrical circuit 220, which is electrically coupled to a power supply 230. Though the power supply 230 is illustrated as a battery, the power supply 230 can be an AC or a DC power supply. The circuit 220 and power supply 230 generate a variable electrical current 240 (e.g., an alternating electrical current, an oscillating electrical current, etc.) that flows through the first transceiver coil 200. The variable electrical current 240 flowing through the first transceiver coil 200 (e.g., through an air-core inductor that includes the first transceiver coil 200) generates a corresponding variable magnetic field 250 that extends axially from the interior 205 of the first transceiver coil 200 in a direction orthogonal to the direction of travel of the variable electrical current 240 through the first coil 200 (e.g., based on the right-hand rule). In some embodiments, the first transceiver apparatus 201 can modulate one or more characteristics (e.g., amplitude and/or frequency) of the variable electrical current 240 to transfer data, commands, signals, and/or other information to the second transceiver coil 210.

The second transceiver coil 210 is disposed on or in an object 211. The object 211 can be an item of merchandise, a pharmaceutical (e.g., a pill, a container or bottle for pills or liquid medication, etc.), a medical device (e.g., an implantable medical device such as a neurostimulator, a pacemaker, an infusion pump such as an insulin pump, a gastric simulator, a defibrillator, or other implantable medical device), or a sensor (e.g., an implantable sensor such as a glucose sensor, a blood flow or pressure sensor, a heart rate sensor, a blood oxygen saturation sensor, a biosensor, or an accelerometer).

The variable magnetic field 250, generated by the first transceiver coil 200, passes through or adjacent to the second transceiver coil 210 when the first and second transceiver coils 200, 210 are disposed proximal to each other (e.g., within about one-half wavelength of the carrier frequency of the operating current, which is generally between about 1 MHz and about 5 GHz, including any range or frequency therebetween). The variable magnetic field 250 generates a corresponding variable electrical current in the second transceiver coil 210, which can be used to power a device that is electrically coupled to the second transceiver coil 210 and/or to transfer information (e.g., data, commands, signals, etc.) back to the first transceiver apparatus 201. For example, the second transceiver coil 210 can be electrically coupled to an electrical circuit that includes logic to modulate the combined impedance of the second transceiver coil 210 and the electrical circuit. The modulated impedance can be detected as data by the first transceiver coil 200 and associated electronics in the first transceiver apparatus 201.

In some embodiments, the combined impedance of the second transceiver coil 210 and the electrical circuit can be modulated to transfer encrypted data to the first transceiver apparatus 201. The encrypted data can be related to the object 201. For example, the encrypted data can be used by the first transceiver coil 200 and associated electronics to determine whether the object 201 is authentic or fraudulent.

The first transceiver apparatus 201 can decrypt the received encrypted data using a cryptographic method such as symmetric key cryptography or asymmetric cryptography (e.g., public key cryptography). After decrypting the data sent from the second transceiver coil 210, the first transceiver apparatus 201 can determine whether the object 201 is authentic based, at least in part, on the decrypted data. For example, the first transceiver apparatus 201 can query a database, which can be stored internally or in network communication with the first transceiver apparatus 201, to determine if the database includes data that corresponds to or is the same as the decrypted data, which can indicate that the decrypted data—and thus the object 201—is authentic or fraudulent. The decrypted data can be unique to the object 201 (e.g., its serial number or other unique identifier) or it can be unique to the class of objects 201 (e.g., data that is unique to a type and/or dose of a pharmaceutical pill).

In other embodiments, the combined impedance of the second transceiver coil 210 and the integrated circuit can be modulated to transfer data collected by an implanted medical device (e.g., a sensor), data relating to the implanted medical device (e.g., the charge level of its battery, its serial number, its software and/or hardware revision number, etc.), and/or performance data of the implanted medical device (e.g., the dates and times of past uses of the implanted medical device, such as the dates and times of past insulin injections, the volume of each injection). Some or all of this data can be encrypted, for example to protect patient privacy.

In some embodiments, the first transceiver coil 200 can have a diameter 205 that is large enough to allow the integrated circuit chip 30 (as described below) that includes the second transceiver coil 210 to be placed or disposed in the interior 205 (e.g., center) of the first transceiver coil 200. For example, the diameter 205 can be larger than the largest dimension of the integrated circuit chip 30.

Figure 2:
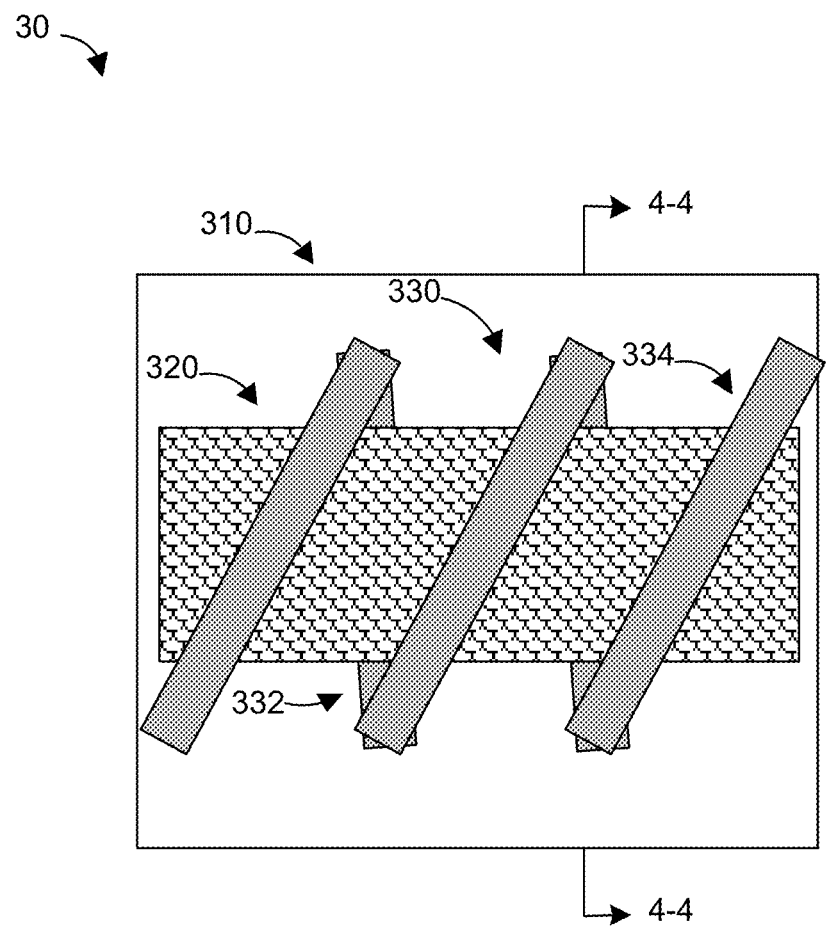
FIG. 2 is a top view of an integrated circuit chip that includes a second transceiver coil that is electrically coupled to an integrated circuit.

FIG. 2 is a top view of an integrated circuit chip 30 that includes a second transceiver coil 310 that is electrically coupled to an integrated circuit. The second transceiver coil 310 can be the same as or different than the second transceiver coil 210. The second transceiver coil 310 includes a planar magnetic core 320 and a conductive winding 330 that turns around in a generally spiral manner (e.g., like a solenoid) on the outside of the planar magnetic core 320. The conductive winding 330 is piecewise constructed of conductive segments 332 disposed on a first level of a multilevel wiring structure of the integrated circuit, conductive segments 334 disposed on a second level of a multilevel wiring structure, and conductive interconnects (not illustrated) (e.g., vertical interconnect accesses or VIAs) that electrically connect conductive segments on the first and second levels of the multilevel wiring structure. The integrated circuit chip 30 can include logic (e.g., logic gates such as in an application-specific integrated circuit or ASIC) or a processor, which can provide the logic for modulating the combined impedance of the second transceiver coil 310 and the integrated circuit to send data to the first transceiver coil 200. The integrated circuit chip 30 can include one or more additional electrical components, in addition to the second transceiver coil 310, such as one or more capacitors (e.g., trench capacitors, MIM capacitors, etc.), one or more resistors, one or more transformers, one or more diodes, and/or one or more inductors. In addition, the integrated circuit chip 30 can include an interface to electrically couple a portion of the integrated circuit to an object (e.g., object 211) such as an implanted medical device or other electrical device, for example to receive information (e.g., data) from the implanted medical device and to transfer at least a portion of the information to the first transceiver apparatus 201. In another example, the interface allows the second transceiver coil 310 to power the object (e.g., object 211) while the first transceiver coil generates a variable magnetic field.

In some embodiments, the integrated circuit chip 30 can have dimensions of less than or equal to 1 mm (length)×1 mm (width)×1 mm (height), such as less than 0.5 mm (length)×0.5 mm (width)×0.5 mm (height). In a specific example, the integrated circuit chip 30 has dimensions of less than or equal to 0.4 mm (length)×0.4 mm (width)×0.2 mm (height).

Figure 3:
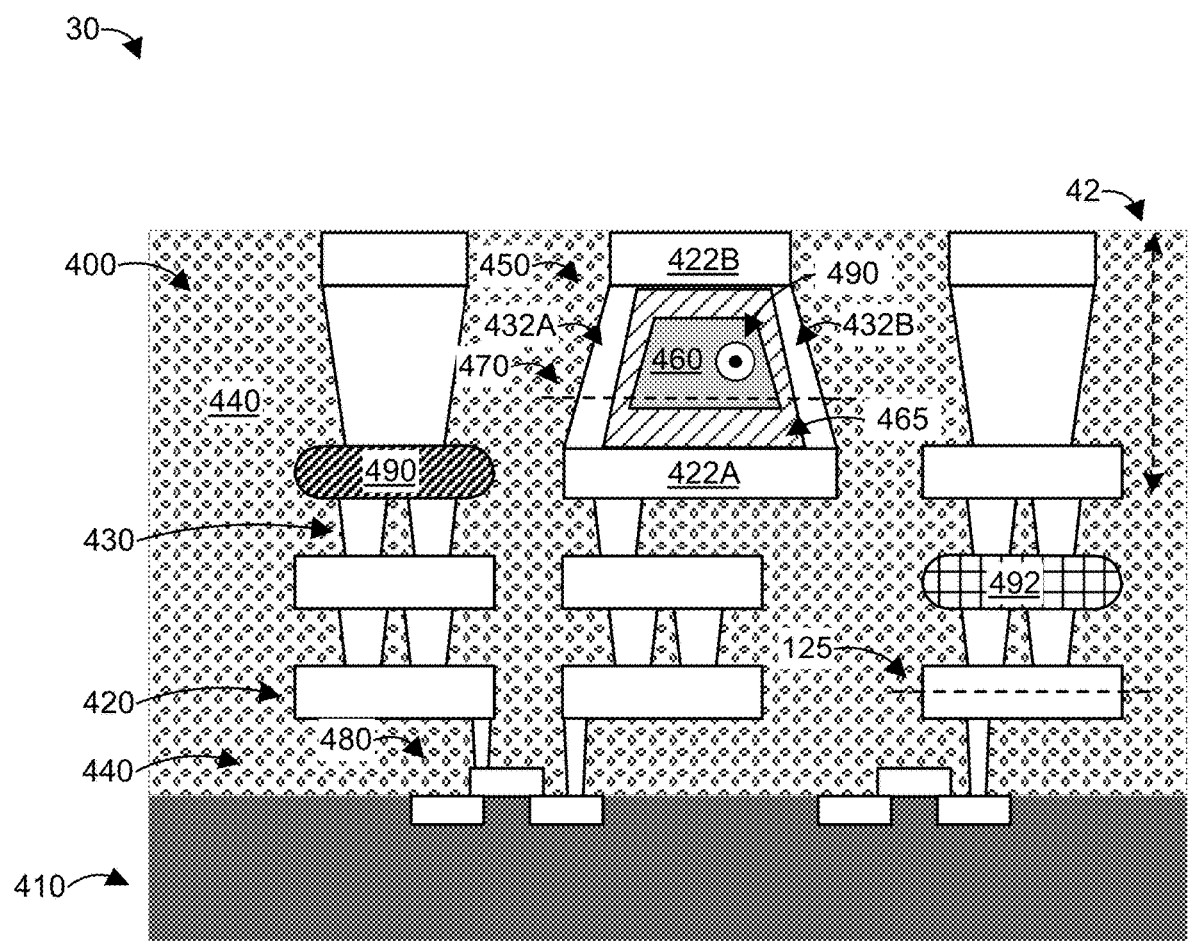
FIG. 3 is a cross section of the integrated circuit chip illustrated in FIG. 2.

FIG. 3 is a cross section through line 4-4 of integrated circuit chip 30 according to one or more embodiments. Integrated circuit chip 30 includes a multilevel wiring structure 400 disposed on a substrate 410. Multilevel wiring structure 400 includes metal wiring levels 420 and vertical conductive interconnects or VIAs 430 that electrically connect adjacent metal wiring levels 420. Metal wiring levels 420 and VIAs 430 are constructed out of a conductive material, such as copper and/or aluminum. Metal wiring levels 420 and VIAs 430 can include additional layers such as titanium, titanium nitride, tantalum, tantalum nitride, and/or other layers. It is noted that multilevel wiring structure 400 can include additional or fewer metal wiring levels 420 and/or VIAs 430 than the number illustrated in FIG. 3. The spaces in the multilevel wiring structure 400 are filled with a dielectric insulating material 440, such as silicon dioxide or silicon nitride.

A thin-film magnetic inductor 450 is integrated into at least a portion of multilevel wiring structure 400. An example of an inductor integrated into a multilevel wiring structure is disclosed in U.S. Pat. No. 9,844,141, issued on Dec. 12, 2017, entitled "Magnetic Core Inductor Integrated with Multilevel Wiring Network," which is incorporated herein by reference.

The inductor 450 includes a single planar magnetic core 460, which can be the same as or different than planar magnetic core 320. In some embodiments, the planar magnetic core 460 can have a laminated configuration. The principal plane 470 of the planar magnetic core 460 is substantially parallel with the planes (e.g., plane 425) defining each metal layer 420. The conductive winding or coil of the inductor 450, which forms a general spiral (e.g., a solenoid) on the outside of the planar magnetic core 460, is piecewise constructed of wire segments 422A, 422B and of VIAs 432A, 432B. The wire segments 422A, 422B that form the winding pertain to at least two of the metal wiring levels 420 (e.g., and the VIAs 432A, 432B that form the parts of the windings that are orthogonal to the principal plane 470 are interconnecting the at least two wiring metal wiring levels 420. The wire segments 422A, 422B can be the same as or different than conductive segments 332, 334, respectively. The conductive winding or coil of inductor 450 can be the same as or different than the second transceiver coil 210 and/or 310. An insulator 465, such as silicon dioxide or silicon nitride, is disposed around the core 460. In some embodiments, the insulator can include a magnetic polymer material. An example of a magnetic polymer material is disclosed in U.S. Patent Application Publication No. 2017/0250133, titled "Systems and Methods for Microelectronics Fabrication and Packaging Using a Magnetic Polymer," published on Aug. 31, 2017, which is hereby incorporated by reference.

The magnetic core 460 can be formed out of an anisotropic material, such as a soft ferromagnetic material (e.g., such as iron (Fe), cobalt (Co), and/or nickel (Ni)). in which the orientation of anisotropy is permanently or semi-permanently fixed. For example, the hard axis of magnetization of the anisotropic material in the core 460 can be oriented parallel to the axis along which the conductive winding or coil extends (into or out of the page in FIG. 3, for example out of the page as indicated by bullseye symbol 490). The easy axis of magnetization of the anisotropic material in the core 460 is oriented orthogonally to the hard axis. Additional details regarding anisotropy of magnetic cores are disclosed in U.S. Pat. No. 9,991,040, titled "Apparatus and Methods for Magnetic Core Inductors with Biased Permeability," issued on Jun. 5, 2018, which is hereby incorporated by reference.

In some embodiments, inductor 450 has a small height 42, such as less than about 100 microns. The small height 42 provides a low profile for inductor 450, allowing it to be integrated into integrated circuit chip 30 in various locations and/or configurations. A representative thickness of wire segments 422A/422B is about 1 µm to about 20 µm, about 5 µm to about 15 µm, about 10 µm, or any value or range between any two of the foregoing thicknesses. A representative thickness of magnetic core 460 is about 100 nm to about 10,000 nm, about 500 nm, about 1,000 nm, about 2,500 nm, about 5,000 nm, about 7,500 nm, or any value or range between any two of the foregoing thicknesses. Therefore, a representative thickness of VIAs 432A/432B is slightly larger than about 2 µm to about 40 µm, such as about 10 µm to about 30 µm, about 15 µm to about 18 µm, about 20 µm, or any value or range of the sum of the thickness of wire segments 422A/422B and core 460. The VIAs 432A/432B can also have a thickness greater than 22 µm up to and including about 50 µm (or more), such as about 25 µm, about 30 µm, about 35 µm, about 40 µm, about 45 µm or any value or range between any two of the foregoing thicknesses. A representative thickness of insulator layer 465 is about 1 nm to about 10,000 nm, including about 2,500 nm, about 5,000 nm, about 7,500 nm, or any value or range between any two of the foregoing thicknesses. As used herein, "about" means plus or minus 10% of the relevant value.

The substrate 410 can include silicon, silicon dioxide, silicon nitride, a layered silicon-insulator structure (e.g., silicon on insulator or SOI), silicon germanium, or a III-V structure such as aluminum gallium arsenide. A plurality of active circuit elements 480, such as CMOS devices, are fabricated on the substrate 410. The active circuit elements 480 may be any kind, such as planar or three-dimensional FinFET type. The active circuit elements 480 and the multilevel wiring structure 400 form an integrated circuit that includes logic to modulate the combined impedance of the conductive winding or coil of inductor 450 (e.g., second transceiver coil 210 and/or 310) and the integrated circuit to transmit information (e.g., data) to the first transceiver apparatus 201. In some embodiments, the multilevel wiring structure 400 is wire routed in a pattern that reduces or minimizes parasitic magnetic coupling between (a) the first and/or second transceiver coils 200, 210/310 and (b) the integrated circuit formed on the integrated circuit chip 30 (excluding the conductive winding of inductor 450). For example, the multilevel wiring structure 400, not including the conductive winding of inductor 450, can be wire routed in a star pattern or a spine pattern.

One or more optional components, shown as representative structures 490, 492, can be integrated into the multilevel wiring structure 400. The representative structure 490 and/or 492 can include one or more capacitors (e.g., trench capacitors, MIM capacitors, etc.), resistors, transformers, diodes, and/or inductors. Such components, including inductor 450, can be electrically coupled in series, in parallel, or a combination thereof, to one another. For example, the integrated circuit chip 30 can include one or more capacitors (e.g., variable capacitors) that form a resonant impedance matching circuit when combined with an inductor (e.g., inductor 450) and/or a transformer, which provides impedance transformation at a particular frequency band. Modulation of the capacitance value in the resonant impedance matching circuit may be used to alter the combined impedance of the inductor (e.g., inductor 450) and the integrated circuit to transmit data from the second coil to the first coil, with the inductor functioning as an antenna.

Figure 4:
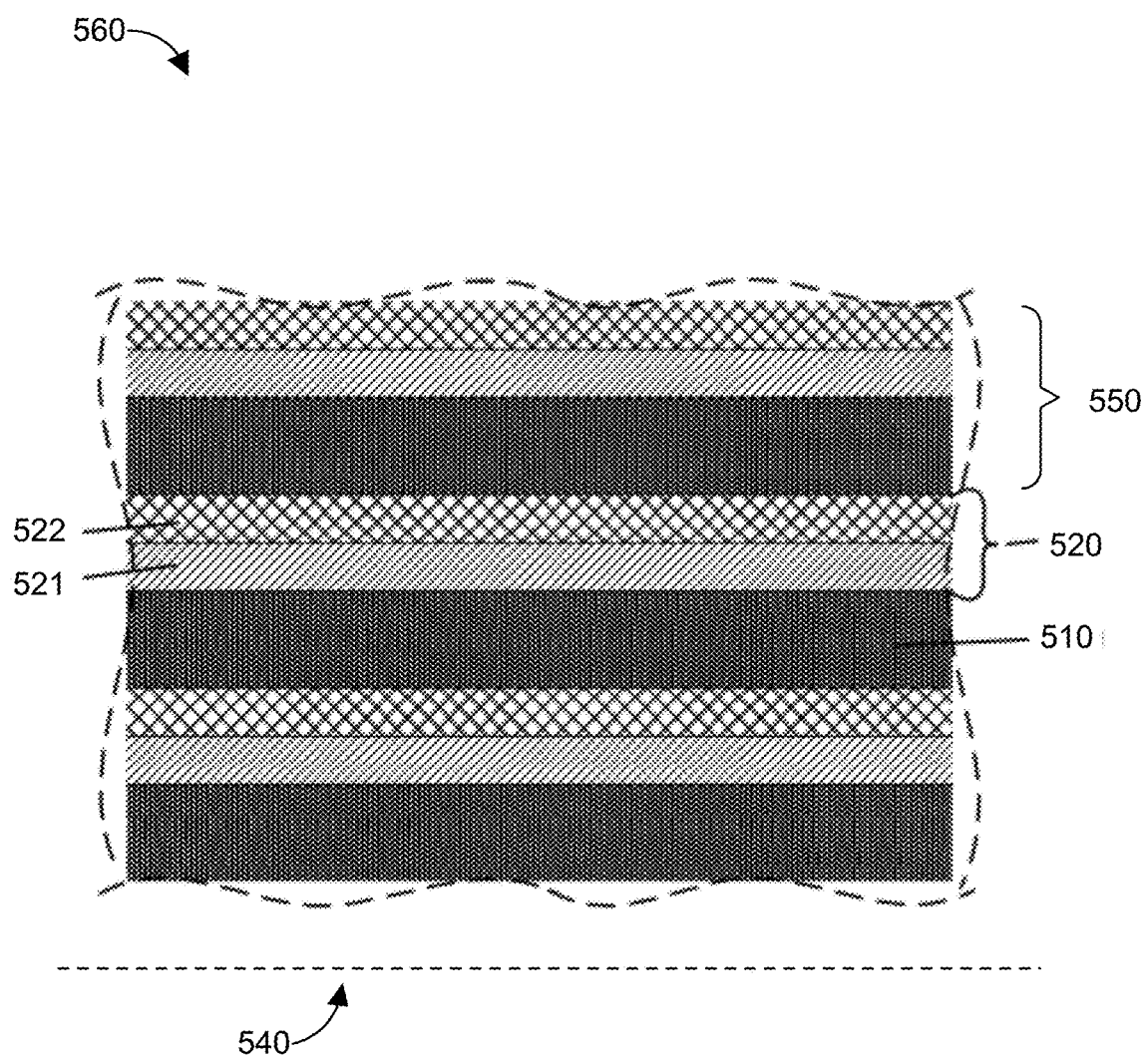
FIG. 4 is a cross sectional view of a laminated magnetic core according to one or more embodiments.

FIG. 4 is a cross sectional view of a laminated magnetic core 560 according to one or more embodiments. The core 560 can be the same as or different than planar magnetic core 460. For example, core 560 can be incorporated into inductor 450. The laminated configuration of core 560 includes at least one layer of a magnetic material 510 and at least one non-magnetic layer 520. The purpose of the non-magnetic layer 520 is to prevent electrical current circulation (e.g., eddy currents) in the planar magnetic core 560 perpendicularly to the principal plane 540, which is parallel with the lamination layers 510, 520. In one embodiment, the magnetic core 560 can include an alternating sequence of up to about 100 layers each, or about 2 to 50 periods 550 of the layers. FIG. 4 shows 3 periods 550 of the layers, where each period 550 includes a magnetic layer 510 and a non-magnetic layer 520. When the core 560 is integrated into inductor 450 (e.g., as the second transceiver coil 210) and oriented as illustrated in FIG. 1, the magnetic flux, from magnetic field 250, passing through the core 560 is orthogonal to the axis along which the magnetic and non-magnetic layers 510, 520 are laminated and parallel to the axis along which the conductive winding or solenoid of the inductor 450 extends (e.g., into or out of the page in FIGS. 3 and 4 with respect to cores 460, 560, respectively).

In an alternative embodiment, the core 560 can include vertical laminations (e.g., laminations that are orthogonal to the laminations illustrated in FIG. 4), for example as disclosed in U.S. Patent Application Publication No. 2018/0182530, titled "Integrated Magnetic Core Inductor with Vertical Laminations," published on Jun. 28, 2018, which is hereby incorporated by reference.

The magnetic layer 510 can include one or more soft ferromagnetic materials, such as Fe, Co, and/or Ni. In one example, the magnetic layer 510 includes CZT, or $Co_xZr_yTa_{1-x-y}$, with x and y being about 0.915 and about 0.04, respectively. The soft ferromagnetic material(s) can be anisotropic having a hard axis of magnetization that passes into or out of the page in FIG. 4, for example as discussed above with respect to core 460.

In some embodiments, the magnetic layer 510 has a high relative permeability. For example, the relative permeability of the magnetic layer 510 can be at least about 50, such as at least about 75, at least about 100, at least about 125, or at least about 150. When the core 560 is integrated into inductor 450 (e.g., as the second transceiver coil 210), the high relative permeability of the magnetic layer 510 (and of the core 560) in the second transceiver coil (e.g., second transceiver coil 210) acts to concentrate the magnetic flux of the first transceiver coil (e.g., first transceiver coil 200) by increasing its inductance, such that the cross-sectional area of the second transceiver coil can be decreased by a factor equal to the relative permeability while maintaining the same or similar identical inductive coupling coefficient k between the first and second coils. For example, the cross-sectional area of the second transceiver coil (e.g., the cross section illustrated in FIG. 1) can be decreased by a factor of 100 when the magnetic layer 510 has a relative permeability of 100 because about 100× more magnetic flux enters the core 560 compared to an air-core inductor. This can allow the cross-sectional area of the second transceiver coil to be less than 1 $mm^2$. Therefore, a high-permeability ferromagnetic core allows the second transceiver apparatus to be substantially miniaturized while maintaining comparable efficiency and fidelity in signal and data transmission between the coils.

The non-magnetic layer 520 can include a dielectric or insulator, such as $SiO_2$ or CoO (including a material or compound having any ratio of cobalt to oxygen atoms), and/or a metal such as Ta and/or its related oxides and/or nitrides (e.g., $Ta_2O_5$, TaN, etc.). In some embodiments, non-magnetic layer 520 itself can be composed of more than one constituent layer. For example, the component layers of non-magnetic layer 520 can include an insulator layer 521 and a metal layer 522. The insulator layer 521 can include $SiO_2$, SiN (including a material or compound having any ratio of silicon to nitrogen atoms), CoO (including a material or compound having any ratio of cobalt to oxygen atoms), polymers such as polyimide, and/or a magnetic polymer. The metal layer 522 can include Ta, W, Ti, and/or any of these metals' respective oxides or nitrides (e.g., $Ta_2O_5$, TaN, $W_2O_3$, $W_2N$, $TiO_2$, and/or TiN). The purpose of the insulating layer 521 can be to prevent or suppress electrical current circulation in the planar magnetic core perpendicularly to the principal plane 540, which can occur in the presence of an alternating or variable magnetic field. Such perpendicular currents are known in the art as eddy currents, and they would lead to energy losses for the inductor. In some embodiments, the insulating layer 521 can prevent or suppress eddy currents in the presence of alternating or variable magnetic fields up to about 3 GHz in frequency. The effectiveness of a given insulating layer or lamination in blocking eddy currents can be based on its thickness, its dielectric constant, its electrical resistivity, and cross-sectional area of the magnetic core.

The metal layer 522 can ease fabrication by smoothing the surface during deposition. The non-magnetic layer 520 can have structures and properties beyond those of simply having constituent layers. In some embodiments of the present invention the non-magnetic layer 520 can have current rectifying properties. For example, the non-magnetic layer 520 can include a semiconducting layer and an interface metal layer, the interface layer disposed between the semiconducting layer and the magnetic layer 510. The semiconducting layer can be a p-type semiconductor having a work function less than the work function of magnetic layer 510. Alternatively, the semiconducting layer can be an n-type semiconductor having a work function greater than magnetic layer 510. The interface metal layer can have a work function less than that of the p-type semiconducting material, or greater than that of the n-type semiconducting material. In some embodiments, the non-magnetic layer 520 includes semiconducting materials that form a p-n junction (or n-p junction). In some embodiments, the non-magnetic layer 520 forms a Schottky diode.

The sequential deposition of the various layers of the laminated structure of core 560 can include some techniques known in the semiconductor processing arts, for instance, masking, sputtering, electroplating. The fabrication of one or more components or layers of laminated magnetic core 560 may be done in the presence of an applied magnetic field to magnetically orient the deposited magnetic layers 510, such as to orient the easy or hard axes of magnetization. For example, the hard axis of magnetization can be oriented such that it is parallel to the axis along which the conductive winding or coil of the inductor extends. Thus, the core 560 can have low magnetic coercivity along the axis along which the conductive winding or coil of the inductor extends.

The thickness of the non-magnetic layers 520 may be in the range of about 5 nm to about 100 nm, about 20 nm to about 80 nm, about 40 nm to about 60 nm, about 50 nm, or any thickness between any two of the foregoing values. The thickness of the magnetic layers 510 can be about 100 nm to about 10,000 nm, including about 500 nm, about 1,000 nm, about 2,500 nm, about 5,000 nm, about 7,500 nm, or any thickness or thickness range between any two of the foregoing values.

Considering the nature of its materials and its structural requirements, representative embodiments of the invention may use differing general approaches for fabricating the planar laminated magnetic cores. A general approach may be centered on sputtering and/or electroplating.

An example of a magnetic core, including a core having a laminate configuration, can be found in U.S. Pat. No. 9,844,141, titled "Magnetic Core Inductor Integrated with Multilevel Wiring Network," issued on Dec. 12, 2017, U.S. Pat. No. 9,647,053, titled "Systems and Methods for Integrated Multi-Layer Magnetic Films," issued on May 9, 2017, which are incorporated herein by reference.

Figure 5:
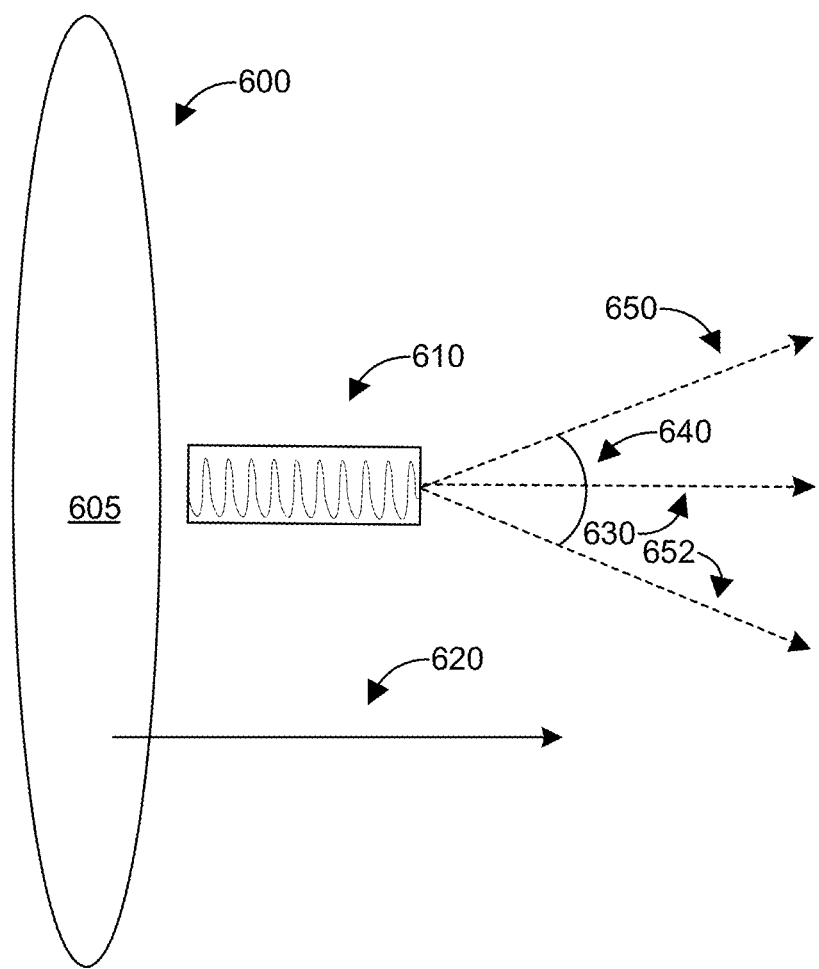
FIG. 5 illustrates a range of optimal orientations for inductively coupling a first coil and a second coil according to one or more embodiments.

FIG. 5 illustrates a range of optimal orientations for inductively coupling a first coil 600 and a second coil 610 according to one or more embodiments. The first coil 600 can be the same as or different than first coil 200. The second coil 610 can be the same as or different than second coil(s) 210 and/or 310. A first magnetic flux, generated by the first coil 600, passes through the interior 605 of the first coil 600 along a first flux axis 620. A second magnetic flux, generated by the second coil 610, passes through a center of the second coil 610 along a second flux axis 630.

To provide an adequate power transfer and/or signal level between the first and second coils 600, 610 (e.g., to maximize inductive coupling), the first and second flux axes 620, 630 are preferably aligned within a predetermined maximum alignment angle 640. For example, while keeping the orientation of the first coil 600 constant, the second coil 610 can be rotated such that the second flux axis 630 is oriented parallel to axis 650, parallel to axis 652, or any orientation therebetween. Of course, the first coil 600 (or both coils 600, 610) can be rotated such that the first flux axis 620 achieves the same relative orientations within the predetermined maximum alignment angle 640.

Figure 6:
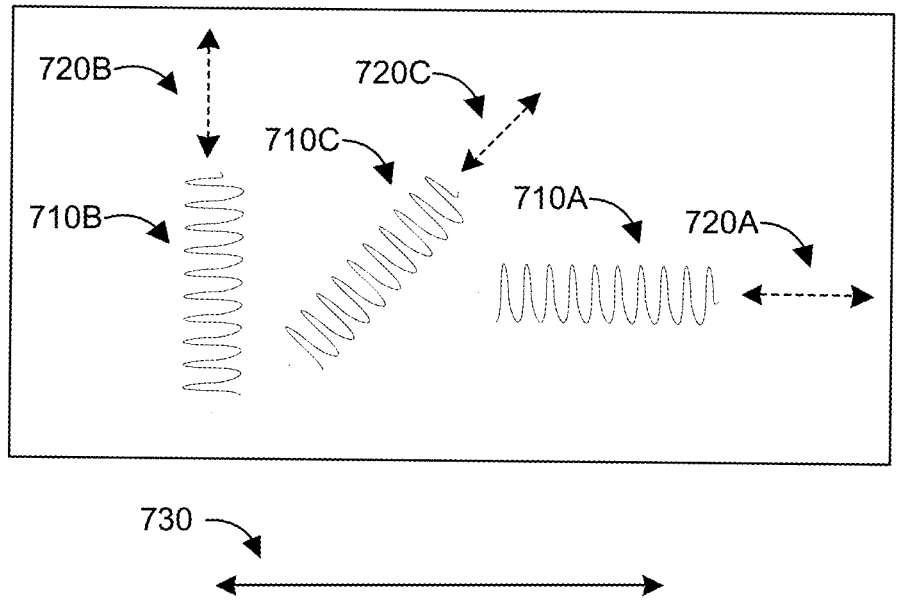
FIG. 6 illustrates an apparatus that includes a plurality of second coils according to one or more embodiments.

In an alternative embodiment, an apparatus can include multiple second coils oriented in different directions to increase the likelihood that the flux axis of one the second coils is oriented within the predetermined maximum alignment angle 640 of the second first flux axis 620. For example, FIG. 6 illustrates an apparatus 70 that includes three second coils 710A-C. The second flux axis 720A of second coil 710A is parallel to reference axis 730. The second flux axis 720B of second coil 710B is orthogonal to reference axis 730. The second flux axis 720B of second coil 710B is oriented at an angle between 0° and 90° with respect to reference axis 730, such as about 30° to about 60° or about 45°. In other embodiments, the apparatus 70 can have additional or fewer second coils, which can be oriented at any angle with respect to each other and with respect to reference axis 730. Each second coil 710A-C can be disposed on the same integrated circuit chip (e.g., integrated circuit chip 30) or on different integrated circuit chips. Alternatively, two or more second coils 710-C can be disposed on one integrated circuit chip while the other second coil is integrated on a different integrated circuit chip.

Figure 7:
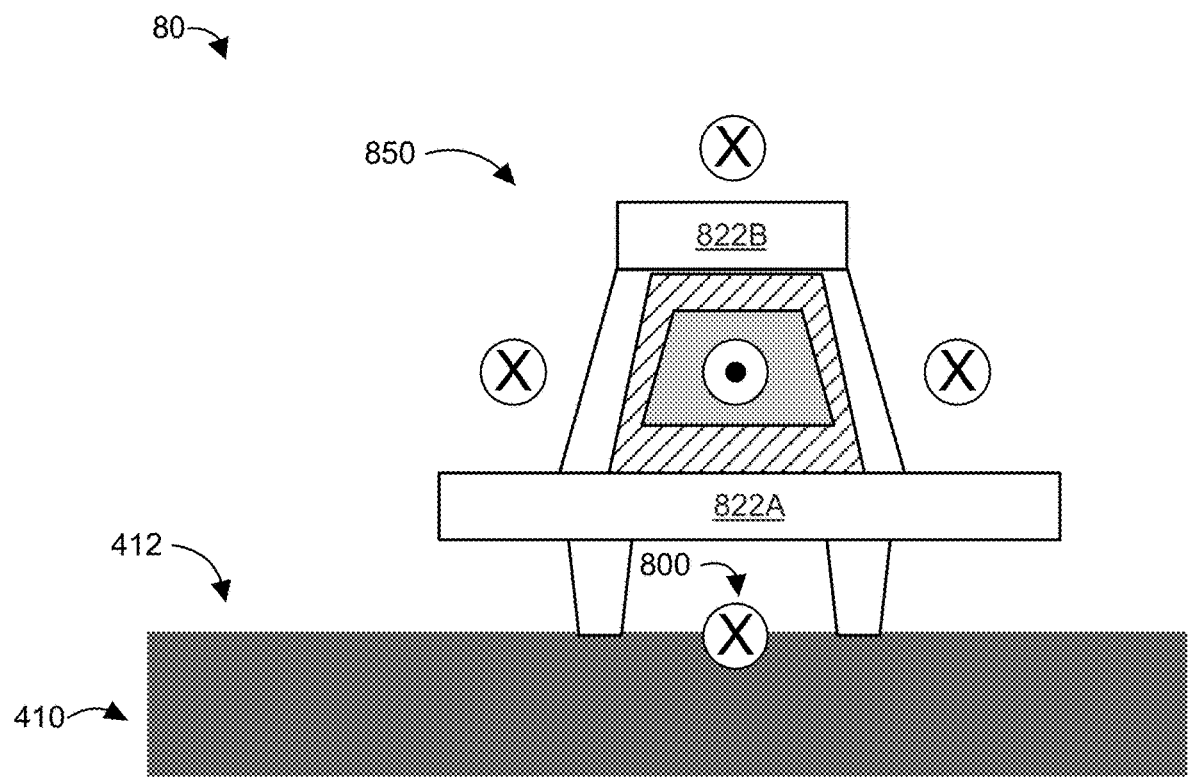
FIG. 7 is a simplified diagram of an integrated circuit chip that includes an inductor that can function as a second transceiver coil.
Figure 8A:
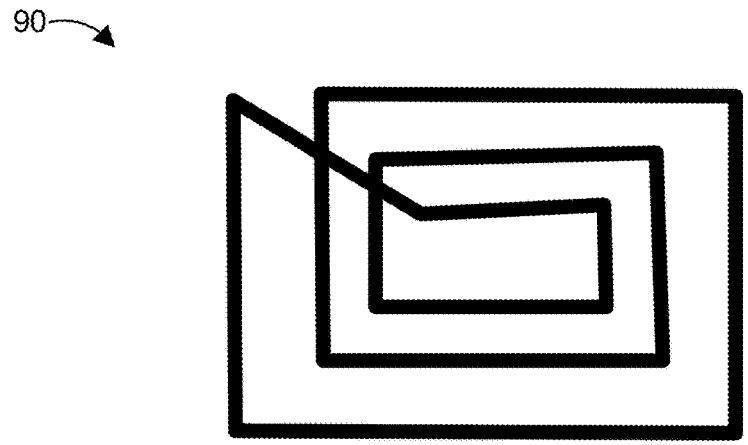
FIGS. 8A and 8B are a top view and a representative cross-sectional view, respectively, of an air-core spiral inductor fabricated on a semiconductor substrate according to the prior art.
Figure 8B:
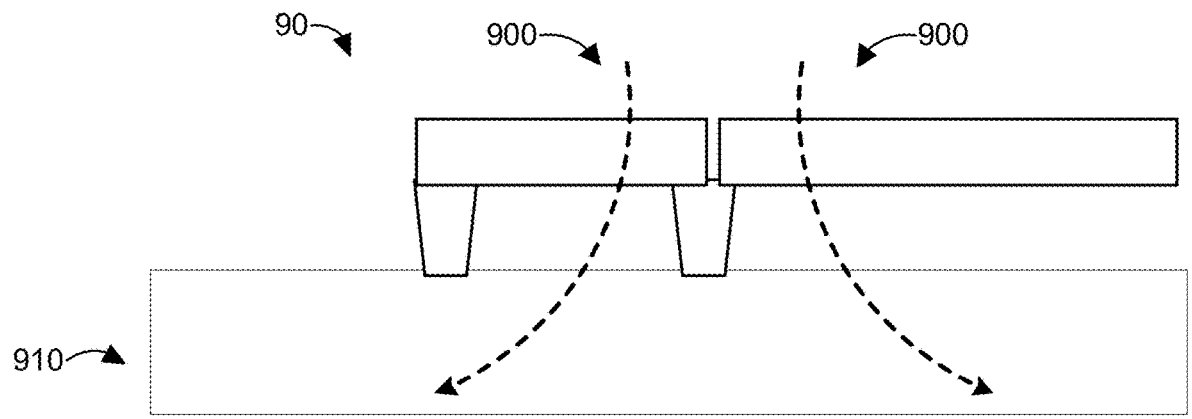

FIG. 7 is a simplified diagram of an integrated circuit chip 80 that includes an inductor 850 that can function as a second transceiver coil. Inductor 850 is the same as inductor 450, but inductor 850 is formed out of conductive segments 822A, B disposed on the first two levels of a multilevel wiring structure. The remainder of the multilevel wiring structure is not illustrated in FIG. 7 for clarity. As illustrated, the magnetic flux through and around the inductor 850 flows out of the page as it passes through the core 860 (as indicated by the bullseye symbol) and it flows into the page as it passes around the inductor 850 coil (as indicated by the X symbol). At least a portion of the magnetic flux 800 that flows below conductive segment 822A passes through the substrate 410 parallel to the surface 412 of substrate 410. Since the magnetic flux 800 is parallel to the surface 412 of substrate 410, a smaller amount of magnetic flux 800 passes through the substrate 410 than in prior art configurations, for example as illustrated in FIGS. 8A-B. The smaller amount of magnetic flux 800 passing through the substrate 410 reduces the parasitic interaction between the substrate 410 and the inductor 850. For example, the configuration illustrated in FIG. 7 has a higher Q factor (a measure of lossiness of an inductor) compared to the prior art configuration illustrated in FIGS. 8A-B without affecting the inductive coupling coefficient k. A higher Q factor provides an increased signal-to-noise ratio for the Inductive coupling wireless link. In some embodiments, the configuration illustrated in FIG. 7 has up to an 8× increase in Q factor compared to the configuration illustrated in FIGS. 8A-B.

FIGS. 8A and 8B are a top view and a representative cross-sectional view, respectively, of an air-core spiral inductor 90 fabricated on a semiconductor substrate 910 according to the prior art. As illustrated, the magnetic flux 900 passes deeper into the substrate 910 than in the configuration illustrated in FIG. 7, which increases the parasitic interaction between the substrate 910 and the inductor 90 compared to the configuration illustrated in FIG. 7.

Figure 9:
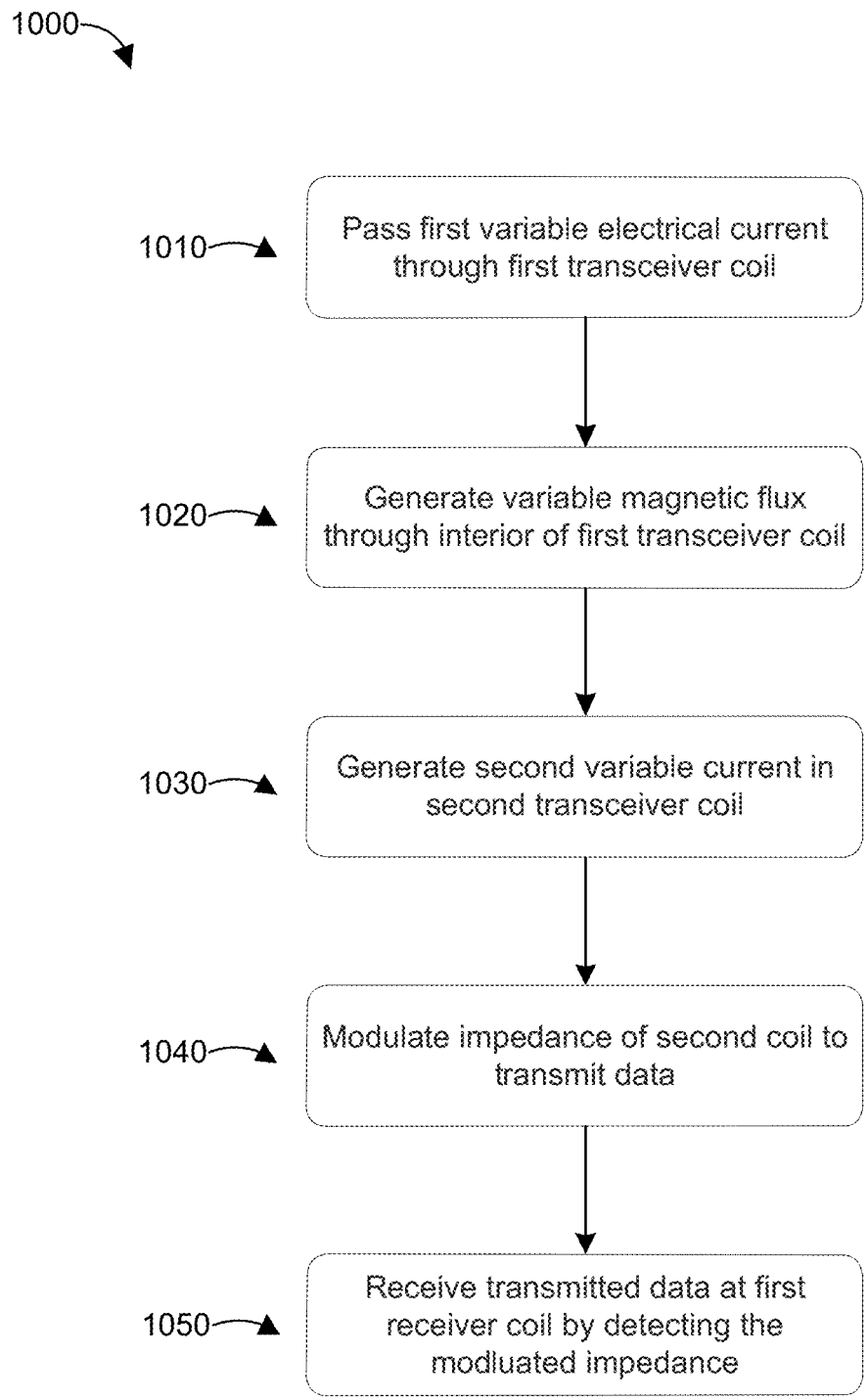
FIG. 9 is a flow chart of a method for transferring power or data through magnetic fields.

FIG. 9 is a flow chart 1000 of a method for transferring power or data through magnetic fields. In step 1010, a first variable electrical current is passed through a first transceiver coil in a first transceiver apparatus. In step 1020, a variable magnetic flux that passes through an interior of the first transceiver coil is generated. The variable magnetic flux extends along a first flux axis to a semiconductor integrated circuit chip, the semiconductor integrated circuit chip includes a second transceiver coil disposed about an outside of a magnetic core. In step 1030, a second variable current in the second transceiver coil is generated. The second variable current is based, at least in part, on the variable magnetic flux. In step 1040, the combined impedance of the second transceiver coil and integrated circuit is modulated (e.g., backscattered) to transmit data to the first transceiver apparatus.

In some embodiments, the method further includes passing the second variable current through an integrated circuit on the semiconductor integrated circuit chip. The integrated circuit includes a multilevel wiring structure that is electrically coupled to active circuit elements. The integrated circuit can provide logic to modulate the combined impedance of the second transceiver coil and integrated circuit which can correspond to data in unencrypted or in encrypted form.

In step 1050, the modulated impedance is detected by the first transceiver apparatus to receive the transmitted data (e.g., the backscattered signal) from the second transceiver coil. If the transmitted data is encrypted, the first transceiver apparatus can decrypt it using a predetermined decryption method. In one example, the transmitted data is a unique identifier relating to an object that is mechanically and/or electrically coupled to the semiconductor integrated circuit chip. After the transmitted data is decrypted, the first transceiver apparatus can query a database in network communication with the first transceiver apparatus to determine if the unique identifier exists in the database. The object can be determined to be authentic when the unique identifier exists in the database. However, the object can be determined to be fraudulent when the unique identifier does not exist in the database.

In some embodiments, the impedance of the first transceiver coil can be modulated to transmit data and/or commands to the second transceiver coil. In some embodiments, the angle between a first magnetic flux axis and a second magnetic flux axis can be angularly restricted to an angular range of 0 degrees to 60 degrees. A first magnetic flux passes through an interior of the first transceiver coil along the first magnetic flux axis and the second magnetic flux passes through an interior of the second transceiver coil along the second magnetic flux axis.

Figure 10:
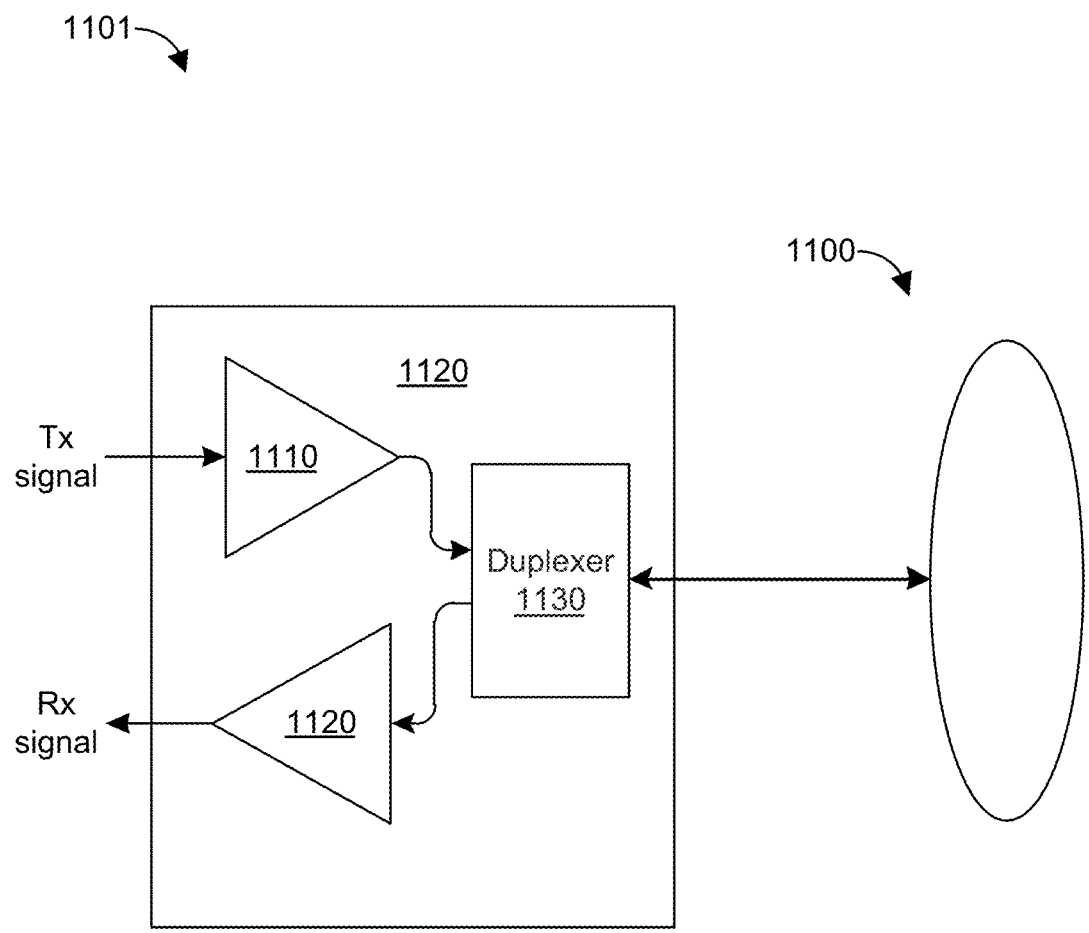
FIG. 10 is a block diagram of the first transceiver apparatus according to one or more embodiments.

FIG. 10 is a block diagram of the first transceiver apparatus 1101 according to one or more embodiments. The first transceiver apparatus 1101 includes an electric circuit 1120 that includes a power amplifier 1110, a low-noise amplifier 1120, and a duplexer 1130. Additional portions of the electric circuit 1120, for example to modulate and demodulate the transmitted and received signals, are not illustrated in FIG. 10. The transmitted signal is amplified by the power amplifier 1110 before it is transmitted to the first coil 1100 via the duplexer 1130. The received signal passes from the first coil 1100 to the duplexer 1130 and then to the low-noise amplifier 1120.

Figure 11:
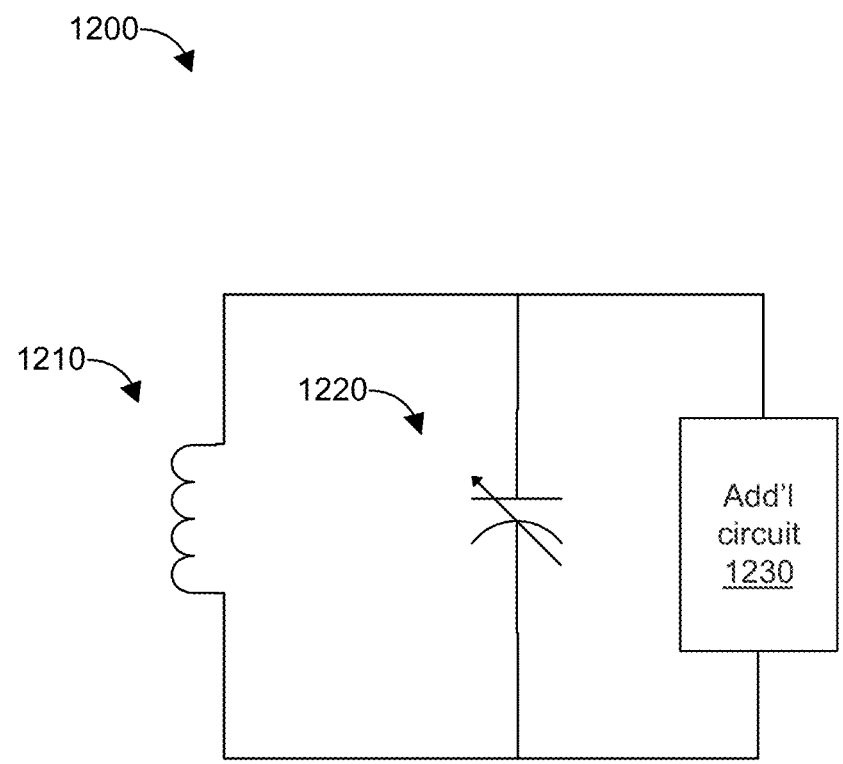
FIG. 11 is a schematic diagram of a portion of an integrated circuit 1200 for the second transceiver coil according to one or more embodiments.

FIG. 11 is a schematic diagram of a portion of an integrated circuit 1200 for the second transceiver coil according to one or more embodiments. The integrated circuit 1200 includes an inductor 1210, a variable capacitor 1220, and additional transceiver electronics 1230. The inductor 1210 and the variable capacitor 1220 are in parallel electrically with each other. The inductor 1210 and variable capacitor 1220 form a resonant impedance matching circuit that provides impedance transformation at a particular frequency band. Modulation of the capacitance value of the variable capacitor 1220 in the resonant impedance matching circuit may be used to alter the combined impedance of the inductor 1210 and the integrated circuit 1200 to transmit data from the second coil to the first coil, with the inductor 1210 functioning as an antenna.

The invention should not be considered limited to the particular embodiments described above, but rather should be understood to cover all aspects of the invention as fairly set out in the attached claims. Various modifications, equivalent processes, as well as numerous structures to which the invention may be applicable, will be apparent to those skilled in the art to which the invention is directed upon review of this disclosure. The claims are intended to cover such modifications and equivalents.

What is claimed is:

1. A method for transmitting power or data through magnetic fields, comprising:
   passing a first variable electrical current through a first transceiver coil in a first transceiver apparatus;
   generating a variable magnetic flux that passes through an interior of the first transceiver coil, the variable magnetic flux extending along a first flux axis to a semiconductor integrated circuit chip, the semiconductor integrated circuit chip including a second transceiver coil disposed about an outside of a magnetic core;
   generating a second variable current in the second transceiver coil, the second variable current based on the variable magnetic flux; and
   modulating an impedance of the second transceiver coil to transmit data to the first transceiver apparatus.

2. The method of claim 1, further comprising passing the second variable current through an integrated circuit on the semiconductor integrated circuit chip, the integrated circuit comprising a multilevel wiring structure that is electrically coupled to active circuit elements.

3. The method of claim 2, wherein the integrated circuit is configured with logic to modulate the impedance of the second transceiver coil to transmit the data to the first transceiver coil.

4. The method of claim 3, wherein the logic is configured to transmit encrypted data to the first transceiver coil.

5. The method of claim 4, wherein the encrypted data includes a unique identifier relating to an object, the object mechanically and/or electrically coupled to the semiconductor integrated circuit chip.

6. The method of claim 5, further comprising detecting the modulated impedance with the first transceiver apparatus to receive the encrypted data.

7. The method of claim 5, further comprising, with the first transceiver apparatus:
   decrypting the encrypted data to receive the unique identifier;
   querying a database in communication with the first transceiver apparatus to determine if the unique identifier exists in the database;
   determining that the object is authentic when the unique identifier exists in the database; and
   determining that the object is fraudulent when the unique identifier does not exist in the database.

8. The method of claim 1, further comprising modulating an impedance of the first transceiver coil to transmit data to the second transceiver coil.

9. The method of claim 1, further comprising angularly restricting an angle between a first magnetic flux axis and a second magnetic flux axis to an angular range of 0 degrees to 60 degrees, wherein a first magnetic flux passes through an interior of the first transceiver coil along the first magnetic flux axis and the second magnetic flux passes through an interior of the second transceiver coil along the second magnetic flux axis.

10. The method of claim 1, wherein the semiconductor integrated circuit chip includes the magnetic core the outside of which the second transceiver coil is disposed about.

11. The method of claim 10, wherein the magnetic core has a laminated configuration.

12. The method of claim 10, wherein the magnetic core includes an alternating sequence of ferromagnetic layers and insulating layers, each insulating layer disposed between neighboring ferromagnetic layers.

13. The method of claim 1, wherein the magnetic core has a laminated configuration.

14. The method of claim 1, wherein the magnetic core includes an alternating sequence of ferromagnetic layers and insulating layers, each insulating layer disposed between neighboring ferromagnetic layers.

15. The method of claim 1, wherein the semiconductor integrated circuit chip includes the magnetic core the outside of which the second transceiver coil is disposed about.

16. The method of claim 15, wherein the magnetic core includes at least one magnetic layer and at least one non-magnetic layer.

17. The method of claim 16, wherein the magnetic core includes about two to fifty periods of the layers, wherein each period includes one of the at least one magnetic layer and one of the at least one non-magnetic layer.

18. The method of claim 16, wherein the magnetic core includes three periods of the layers.

19. The method of claim 1, wherein the magnetic core includes at least one magnetic layer and at least one non-magnetic layer.

20. The method of claim 19, wherein the magnetic core includes about two to fifty periods of the layers, wherein each period includes one of the at least one magnetic layer and one of the at least one non-magnetic layer.

* * * * *